(12) United States Patent
Mishra

(10) Patent No.: US 8,792,650 B2
(45) Date of Patent: Jul. 29, 2014

(54) CM AMPLIFIER DIVIDED OUTPUT SUPPLYING FIRST, SECOND, CM AMPLIFIER INPUTS

(75) Inventor: Vineet Mishra, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 447 days.

(21) Appl. No.: 13/158,236

(22) Filed: Jun. 10, 2011

(65) Prior Publication Data

US 2012/0314880 A1 Dec. 13, 2012

(51) Int. Cl.
*A61F 11/06* (2006.01)
*H04B 15/00* (2006.01)

(52) U.S. Cl.
USPC ............ 381/71.1; 381/94.6; 381/74; 381/120

(58) Field of Classification Search
USPC .............. 381/71.1, 94.1–94.9, 120, 111, 116, 381/117; 330/69
See application file for complete search history.

(56) References Cited

U.S. PATENT DOCUMENTS 7,010,131 B1 * 3/2006 Rhode et al. .................. 381/120

* cited by examiner

*Primary Examiner* — Xu Mei
*Assistant Examiner* — Ammar Hamid
(74) *Attorney, Agent, or Firm* — Lawrence J. Bassuk; Frederick J. Telecky, Jr.

(57) ABSTRACT

A driver circuit includes a first driver amplifier that is configured to generate a first output in response to a first reference voltage input and a first audio input; a second driver amplifier that is configured to generate a second output in response to the first reference voltage and a second audio input; and a common mode (CM) amplifier, coupled to the first driver amplifier and the second driver amplifier. The CM amplifier is configured to generate an output in response to a second reference voltage input, the first reference voltage input being a divided version of the output. Gains of the first driver amplifier, second driver amplifier and the CM amplifier are equal. Noise at the output appears across a plurality of resistors coupled at the outputs of the first driver amplifier, second driver amplifier and the CM amplifier and cancels with respect to the output of the CM amplifier.

13 Claims, 5 Drawing Sheets

CM AMPLIFIER DIVIDED OUTPUT SUPPLYING FIRST, SECOND, CM AMPLIFIER INPUTS

TECHNICAL FIELD

Embodiments of the disclosure relate to noise reduction in a stereo headset amplifier.

BACKGROUND

A stereo headset amplifier driving unit in audio applications is configured to drive an audio signal across a speaker coupled to the amplifier. The stereo headset amplifier driving unit includes a chip located in an audio system (e.g., mobile phone), and the speakers include a pair of earphones coupled to the audio system. A constituent driver amplifier of the driving unit is powered by a supply voltage, a fraction of which may bias the audio output of the driver amplifier. When the speaker is coupled to the headset amplifier driving unit, the DC bias across the speaker contributes to undesired power dissipation. Additionally, noise in the circuit will be audible across the speaker over the DC bias as a hum.

Schemes utilized in removing the DC bias in the audio output across the speaker may include a capacitive scheme configured to decouple the DC bias from the audio output, a common mode (CM) amplifier scheme having an extra CM amplifier to generate a CM voltage equal to the DC bias in the audio output, and a "negative voltage" scheme configured to enable the audio output to swing below a ground voltage. The "negative voltage" scheme involves generation of a negative supply voltage from the positive supply voltage through a charge pump. In the capacitive scheme and the CM amplifier scheme, the noise across the speaker coupled to the headset driving unit is dependent on a reference voltage input to the driver amplifier and/or the CM amplifier configuration. The "negative voltage" scheme solves the aforementioned problems associated with the capacitive scheme and the CM amplifier scheme, but causes increased power consumption from the positive supply voltage. Moreover, the generation of the negative supply voltage through the charge pump necessitates the use of an extra processing mask for creation of a deep N-well. Thus, there is an increased area/cost requirements associated with the "negative voltage" scheme.

SUMMARY

In one embodiment, a driver circuit includes a first driver amplifier that is configured to generate a first output in response to a first reference voltage input and a first audio input; a second driver amplifier that is configured to generate a second output in response to the first reference voltage and a second audio input; and a common mode (CM) amplifier, coupled to the first driver amplifier and the second driver amplifier. The CM amplifier is configured to generate an output in response to a second reference voltage input. The first reference voltage input is a divided version of the output. Also, gains of the first driver amplifier, second driver amplifier and the CM amplifier are equal. Noise at the CM amplifier output appears across a plurality of resistors coupled at the outputs of the first driver amplifier and second driver amplifier and cancels with respect to CM amplifier output.

In another embodiment, a method includes generating a CM voltage at an output of a CM amplifier based on a reference voltage input and deriving a reference voltage input to a first driver amplifier based on the CM voltage at the output of the CM amplifier. An audio input is provided to the first driver amplifier having an audio input. The method also includes replicating a noise at the output of the CM amplifier at an audio output of the first driver amplifier through a configuration of a feedback circuit associated with the CM amplifier and a feedback circuit associated with the first driver amplifier such that the CM amplifier and the first driver amplifier have same gain amplitude.

In yet another embodiment, an audio system includes an audio source configured to generate an audio signal and a set of driver circuits including a first driver amplifier and a second driver amplifier. Each of the first driver amplifier and the second driver amplifier is configured to generate an audio output based on an audio input and includes a feedback circuit coupled between a terminal associated with the audio output and a terminal configured to receive the audio input. The audio system also includes a CM amplifier coupled to the first driver amplifier and the second driver amplifier and configured to generate a CM voltage at an output based on a reference voltage input. The CM amplifier includes a feedback circuit coupled between the output and an input terminal. A reference voltage input to the first driver amplifier and the second driver amplifier is derived based on the CM voltage through the input terminal of the CM amplifier. The feedback circuit of the CM amplifier, the feedback circuit of the first driver amplifier and the feedback circuit of the second driver amplifier are configured to enable the CM amplifier, the first driver amplifier and the second driver amplifier to have a same gain amplitude such that a noise at the output of the CM amplifier is replicated at each of the terminal of the first driver amplifier and the second driver amplifier associated with the audio output to render a differential noise across the terminal of the each of the first driver amplifier and the second driver amplifier associated with the audio output independent of the noise at the output of the CM amplifier.

Further, the audio system includes a first interface associated with the audio output of the first driver amplifier, a second interface associated with the output of the CM amplifier, a third interface associated with the audio output of the second driver amplifier, a first speaker and a second speaker. The noise at the output of the CM amplifier is differentially canceled across each of the first speaker and the second speaker when they are coupled between the first interface and the second interface and the third interface and the second interface respectively.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Disclosed are a method, an apparatus and/or a system for noise reduction in a headset amplifier driver circuit. Although the present embodiments have been described with reference to specific example embodiments, it will be evident that various modifications and changes may be made to these embodiments without departing from the broader spirit and scope of the various embodiments.

Figure 1:
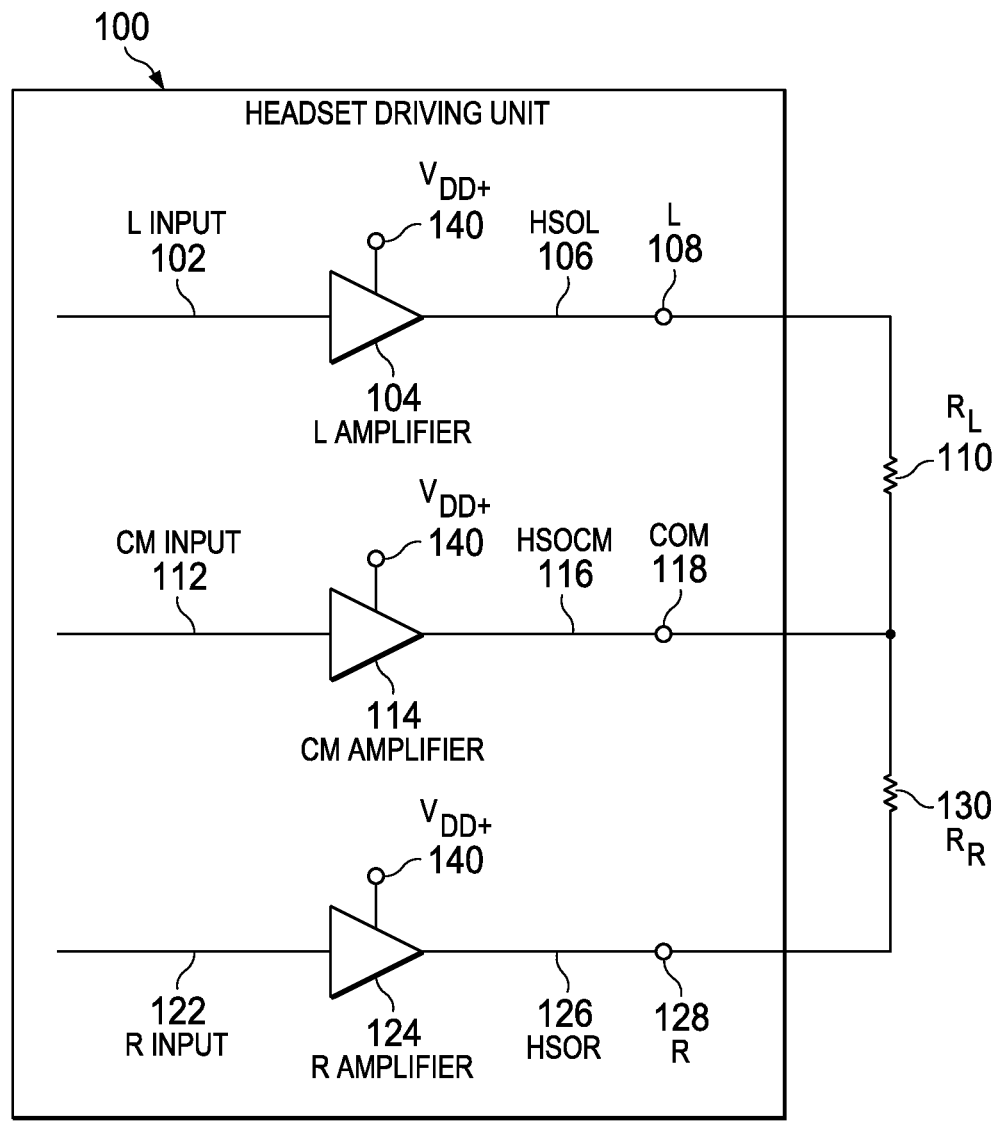
FIG. 1 is a schematic view of a headset driving unit including a common mode (CM) amplifier coupled to a pair of speakers.

FIG. 1 illustrates a headset driving unit 100 including a common mode amplifier (CM amplifier) 114 coupled to a pair of speakers. The headset driving unit 100 includes a left amplifier 104 (L amplifier 104) associated with a left terminal 108 (L 108), a right amplifier 124 (R amplifier 124) associated with a right terminal 128 (R 128) and CM amplifier 114 associated with a common terminal 118 (COM 118). L amplifier 104, R amplifier 124 and CM amplifier 114 are configured respectively to drive HSOL (Headset output left or simply output left) 106, HSOR (Headset output right or simply output right) 126, and HSOCM (headset common mode output) 116, which are the outputs, at the aforementioned terminals. The inputs to L amplifier 104, R amplifier 124 and CM amplifier 114 are L input 102, R input 122 and CM input 112 respectively. L input 102 and R input 122 are outputs of a Digital-to-Analog Converter (DAC) configured to convert outputs of a digital audio source associated with the L channel and the R channel of a stereophonic audio system including headset driving unit 100 to an analog format suited to the requirements of L amplifier 104 and R amplifier 124.

A chip associated with headset driving unit 100 including L amplifier 104 and R amplifier 124 utilizes a single supply voltage $V_{DD+}$ 140, as illustrated in FIG. 1. HSOL 106 and HSOR 126 are biased at a voltage lower than $V_{DD+}$ 140. CM amplifier 114 is configured to generate an output voltage, i.e., HSOCM 116, equal to the bias voltage lower than $V_{DD+}$ 140 to which HSOL 106 and HSOR 126 are biased through an appropriate input voltage, CM input 112. In an embodiment CM amplifier 114 is a part of the chip associated with headset driving unit 100 including L amplifier 104 and R amplifier 124. The resistance associated with the L speaker is $R_L$ 110 and the resistance associated with the R speaker is $R_R$ 130. While L amplifier 104 and R amplifier 124 are configured to drive HSOL 106 and HSOR 126 including audio signal components therein into $R_L$ 110 and $R_R$ 130 respectively, CM amplifier 114 is configured to enable removal of the direct current (DC) bias voltage (e.g., fraction of $V_{DD+}$ 140) across $R_L$ 110 and $R_R$ 130 in HSOL 106 and HSOR 126 through the generation of an output, HSOCM 116, equal to the DC bias voltage. Thus, the DC voltage component of each of HSOL 106 and HSOR 126 is not dropped across the speakers associated with headset driving unit 100. For example, if both HSOL 106 and HSOR 126 swing from 1+0.5 V to 1−0.5V (here, there is a 1V DC bias, along with the alternating current (AC) component), then CM amplifier 114 is configured to generate an HSOCM 116 voltage of 1V. Thus, the voltage across $R_L$ 110 and the voltage across $R_R$ 130 merely swings from +0.5V AC to −0.5 V AC. In one embodiment, under idle conditions where both HSOL 106 and HSOR 126 are 1V (i.e., no "audio output"), the voltages across $R_L$ 110 and $R_R$ 130 will be 0, leading to no wastage of power (due to zero current across $R_L$ 110 and $R_R$ 130) across $R_L$ 110 and $R_R$ 130. It is noted that current is not drawn by $R_L$ 110 and $R_R$ 130 from L amplifier 104 and R amplifier 124 respectively. The CM voltage is also equal to a ground (GND) voltage.

Due to an extra amplifier, viz. CM amplifier 114, in the circuit, the noise power in the circuit increases by a factor of two. Noise across each of $R_L$ 110 and $R_R$ 130 increases by √2, as the noise power at COM 118 is uncorrelated to the noise power at L 108/R 128. Thus, in order to cut down noise power in the circuit, the area of L amplifier 104 and R amplifier 124 needs to be doubled, leading to stringent area budgets within the chip including headset driving unit 100 (i.e., including the amplifiers L amplifier 104, R amplifier 124, and CM amplifier 114). Additionally, the power consumed within the circuit including headset driving unit 100 and the speakers are increased due to the current associated with CM amplifier 114. Headset driving unit 100 including L amplifier 104, R amplifier 124 and CM amplifier 114 is a differential amplifier, where performance is impacted due to the area and power constraints.

Figure 2:
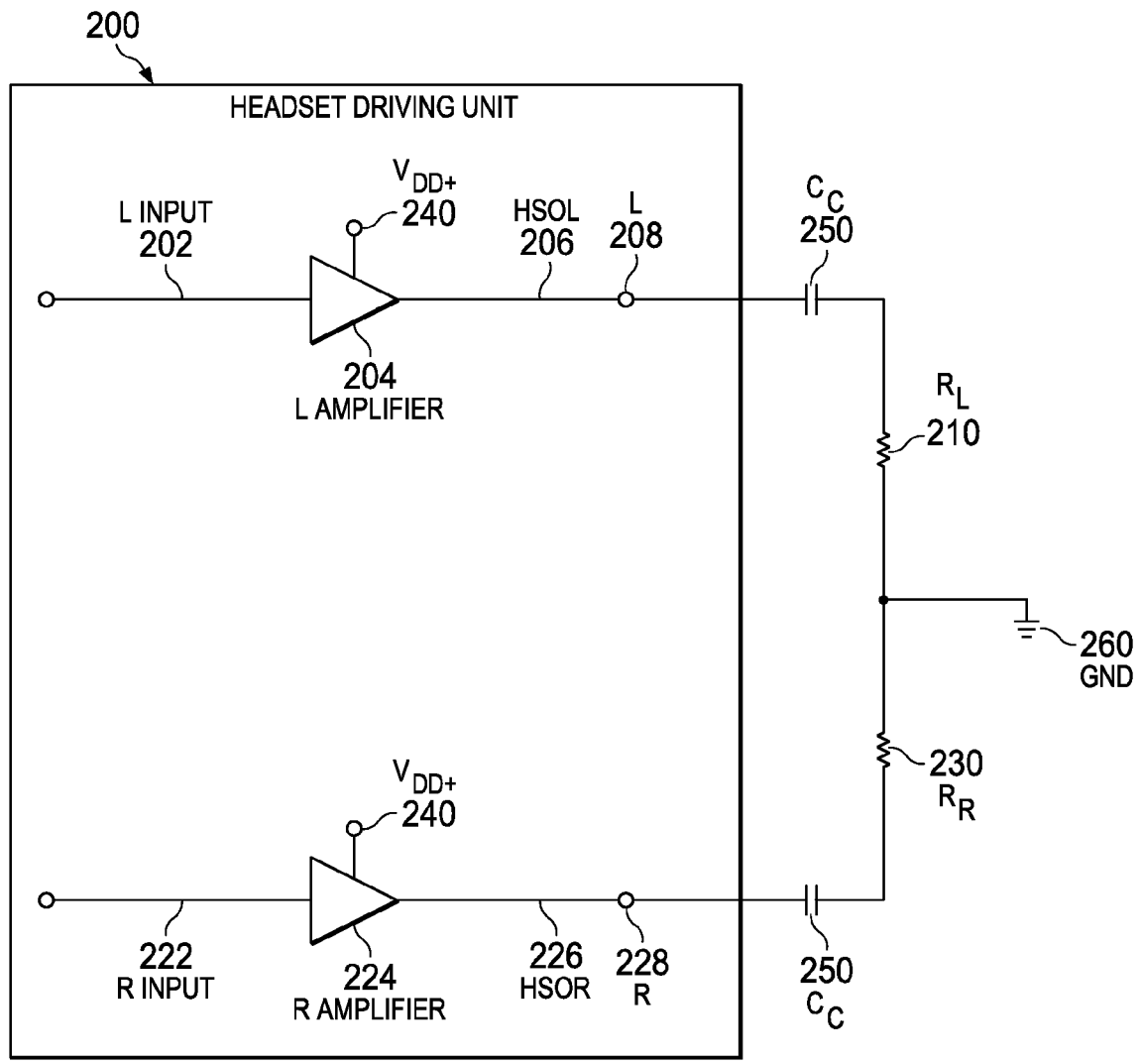
FIG. 2 is a schematic view of a headset driving unit, with capacitors configured to decouple a direct current (DC) bias from the outputs of driver amplifiers therein across a pair of speakers.

FIG. 2 illustrates a headset driving unit 200, with capacitors $C_C$ 250 configured to decouple the DC bias from HSOL 206 and HSOR 226 across $R_L$ 210 and $R_R$ 230. HSOL 206, HSOR 226, L 208, R 228, L input 202, R input 222, $R_L$ 210, $R_R$ 230, L amplifier 204, R amplifier 224 and $V_{DD+}$ 240 are analogous to HSOL 106, HSOR 126, L 108, R 128, L input 102, R input 122, $R_L$ 110, $R_R$ 130, L amplifier 104, R amplifier 124 and $V_{DD+}$ 140 respectively. As capacitor blocks a DC signal and passes an AC signal, the voltage across $R_L$ 210 and $R_R$ 230 are AC voltages. As illustrated in FIG. 2, $C_C$ 250 is coupled between L 208 and R 228 (analogous to L 108 and R 128) of headset driving unit 200 and the corresponding $R_L$ 210 and $R_R$ 230.

As $C_C$ 250 will suffice to decouple the DC bias across $R_L$ 210 and $R_R$ 230, there is no requirement of a CM amplifier in the vein of CM amplifier 114. Also, the reference voltage of the circuit is a ground voltage (e.g., GND 260) or any other voltage. The choice of capacitor $C_C$ 250 is made based on example Equation (1) as:

$$C_c = \frac{1}{2\pi f_c Z}, \quad (1)$$

where $f_c$ is the desired cut-off frequency and Z is the load-impedance associated with headset driving unit 200 including $R_L$ 210 and $R_R$ 230. Assuming Z to be 16 ohms or 32 ohms, $C_C$ 250 has to be very large. For example, $C_C$ 250 varies between 22 μF and 220 μF, depending on the choice of parameters. Thus, the bulkiness of $C_C$ 250 necessitates increased board space associated with the circuit. Also, $C_C$ 250 is outside a chip including headset driving unit 200 (i.e., including L amplifier 204 and R amplifier 224). In addition to bulkiness of $C_C$ 250, the cost associated therewith also adds to the cost of the circuit.

Figure 3:
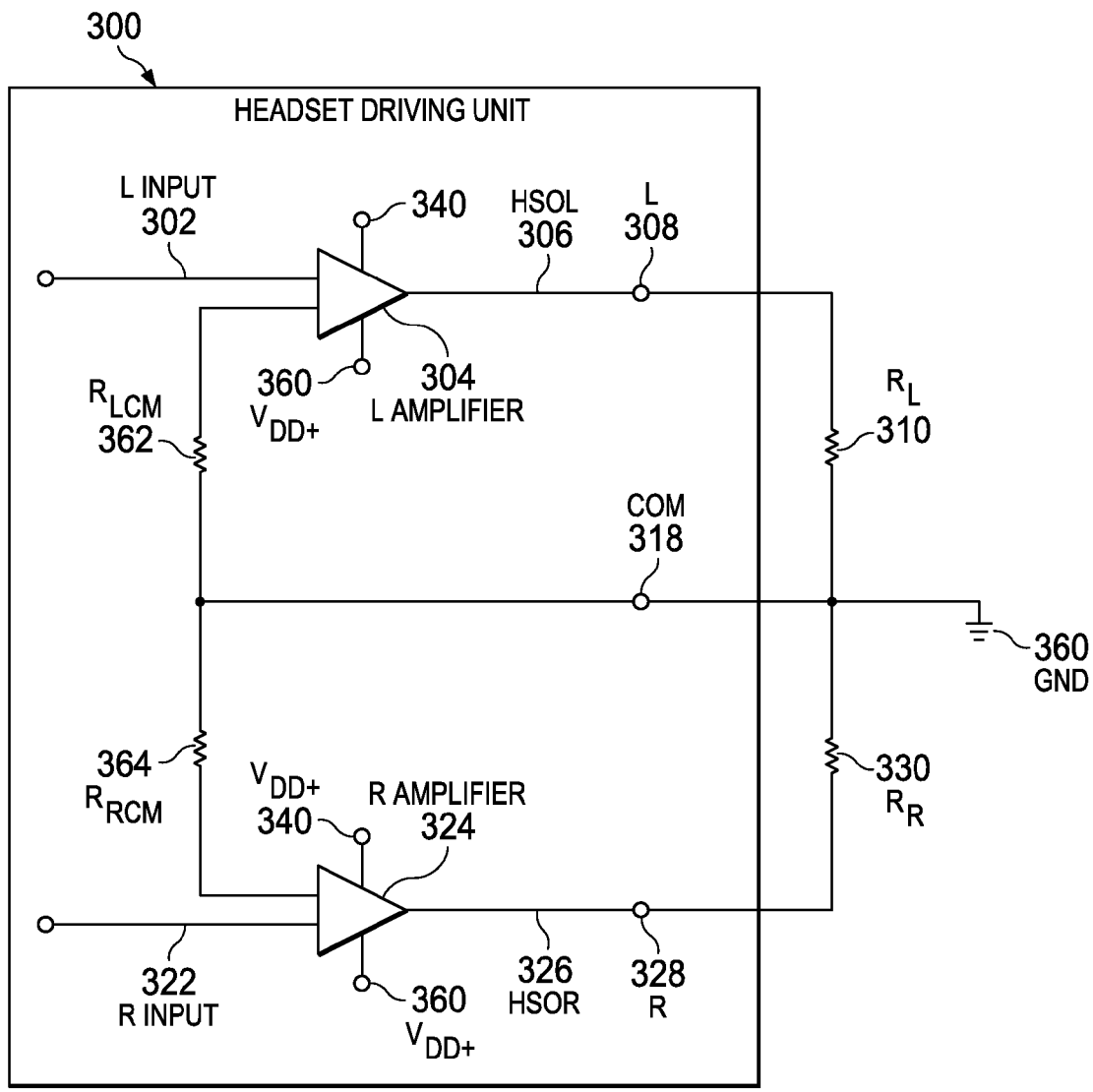
FIG. 3 is a schematic view of a headset driving unit coupled to a pair of speakers, with the common mode centered to a ground voltage.

FIG. 3 illustrates headset driving unit 300 coupled to a pair of speakers, with the CM centered to a ground voltage (GND 360). L input 302, R input 322, L 308, R 328, COM 318, L amplifier 304, R amplifier 324, HSOL 306, HSOR 326, $R_L$ 310, $R_R$ 330 and $V_{DD+}$ 340 are analogous to L input 102, R input 122, L 108, R 128, COM 118, L amplifier 104, R amplifier 104, HSOL 106, HSOR 126, $R_L$ 110, $R_R$ 130 and $V_{DD+}$ 140 respectively. In order to aid potential balance in the circuit, resistors $R_{LCM}$ 362 and $R_{RCM}$ 364 are coupled to L amplifier 304 and R amplifier 324 respectively through one terminal and to one another through the other terminal. The path coupling $R_{LCM}$ (left common mode) 362 and $R_{RCM}$ (right common mode) 364 are held at HSOCM 316, which is equal to GND 360. For example, the "audio output" of L amplifier 304 and R amplifier 324, i.e., HSOL 306 and HSOR 326, swings between 0+0.5V AC and 0−0.5V AC with no DC bias therein because the CM is centered to GND 360. Thus, HSOL 306 and HSOR 326 swings below GND 360. In order to drive HSOL 306/HSOR 326 below GND 360, the circuit requires a negative supply voltage (e.g., $V_{DD-}$ 360. As seen in FIG. 3, L amplifier 304 and R amplifier 324 may utilize $V_{DD-}$ 360 as a supply voltage in addition to $V_{DD+}$ 340). Generating $V_{DD-}$ 360 requires the utilization of a negative charge pump, which includes one or more capacitors (e.g., two external capacitors) as storage elements in the aforementioned generation. Moreover, the charge pump draws a significant amount of current from $V_{DD+}$ 340 for the negative voltage generation, leading to increased power consumption. Most importantly, configuration of the negative charge pump necessitates the use of a separate extra processing mask for creation of a deep N-well. The extra processing mask adds an additional expense of 2-3% to the silicon (Si) floor plan associated with the chip design.

Figure 4:
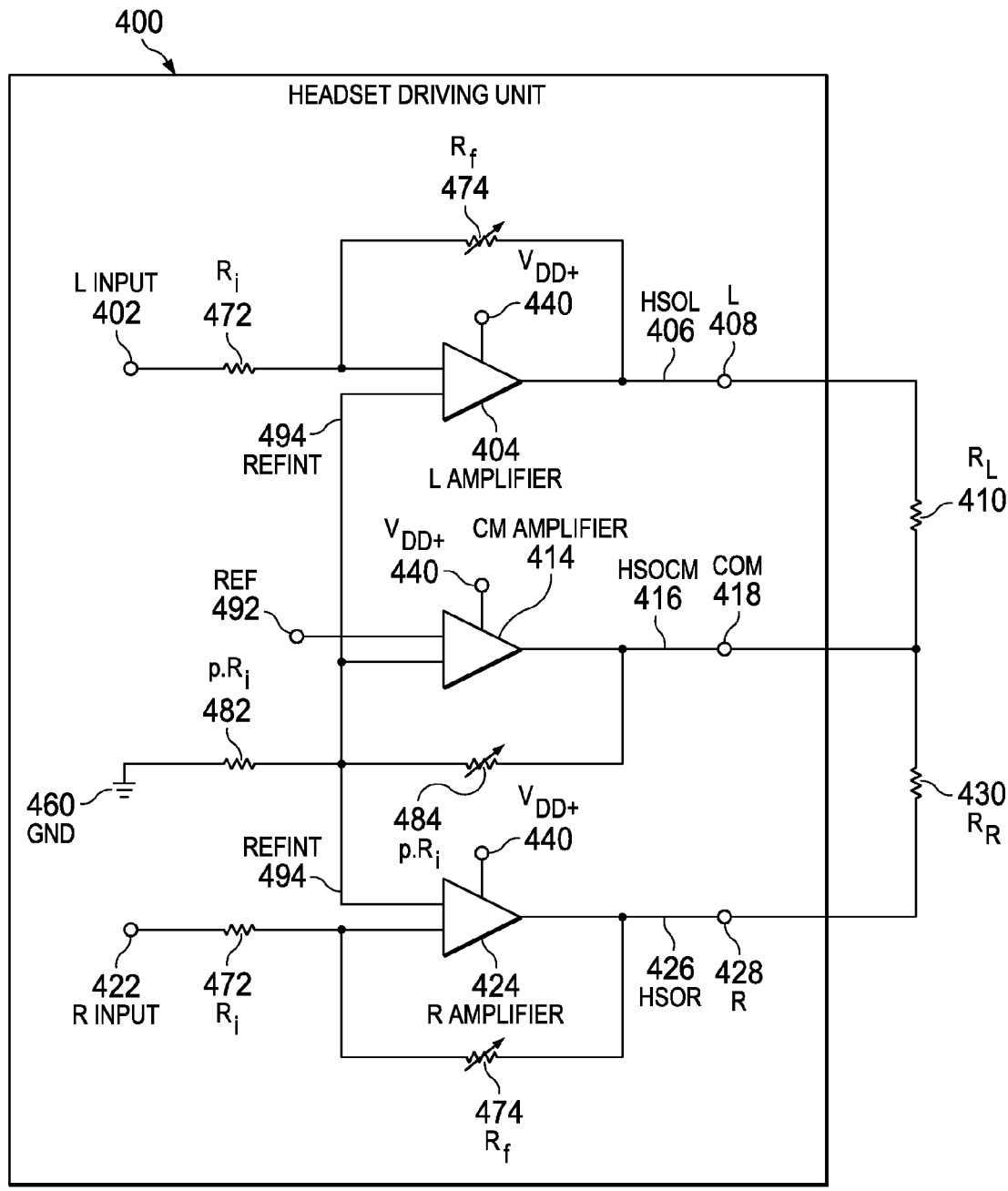
FIG. 4 is a schematic view of a headset driving unit configured to cancel noise associated with a CM amplifier across speakers associated with a headset coupled, according to one or more embodiments.

FIG. 4 illustrates a headset driving unit 400 configured to completely cancel noise across speakers associated with a headset, according to an embodiment. L amplifier 404 (first driver amplifier), R amplifier 424 (second driver amplifier), L input 402, R input 422, L 408, R 428, COM 418, HSOL 406, HSOR 426, $R_L$ 410, $R_R$ 430 and $V_{DD+}$ 440 are analogous to L amplifier 104, R amplifier 124, L input 102, R input 122, L 108, R 128, COM 118, HSOL 106, HSOR 126, $R_L$ 110, $R_R$ 130 and $V_{DD+}$ 140 respectively. In an embodiment, headset driving unit 400 does not include a negative supply voltage, akin to headset driving unit 300 of FIG. 3.

As illustrated in FIG. 4, each of L amplifier 404 and R amplifier 424 includes an input resistor $R_i$ 472 and a feedback resistor $R_f$ 474. Therefore, the amplitude of the gain of each of L amplifier 404 and R amplifier 424 can be expressed in example Equation (1) as:

$$G_{L,R} = \frac{R_f}{R_i}, \quad (1)$$

where $G_L$ and $G_R$ are the gain amplitudes associated with L amplifier 404 and R amplifier 424 respectively.

Headset driving unit 400 includes a CM amplifier, CM amplifier 414 (common mode amplifier), which is operated using the same gain configuration as L amplifier 404 and R amplifier 424. Therefore, CM amplifier 414, for example, uses an appropriate configuration of an input resistor and a feedback resistor such that the gain amplitude associated with CM amplifier 414 is the same as the gain amplitude associated with L amplifier 404 and R amplifier 424. As illustrated in FIG. 4, each of the input resistor and the feedback resistor associated with CM amplifier 414 are chosen as the same scalar multiple (e.g., p) of $R_i$ 472 and $R_f$ 474 (e.g., p·$R_i$ 482, p·$R_f$ 484). Thus, the gain amplitude of CM amplifier 414 can be expressed in example Equation (2) as:

$$G_{CM} = \frac{p \cdot R_f}{p \cdot R_i} = G_{L,R} = G, \quad (2)$$

where $G_{CM}$ is the gain amplitude of CM amplifier 414. $G_{CM}$ and $G_{L,R}$ are referred to as G for the sake of convenience due to the equality.

Value of p is chosen to be as large as possible to reduce the feedback current through p·$R_f$ 484 associated with CM amplifier 414. Thus, the input resistor and the feedback resistor associated with CM amplifier 414 is much larger than the corresponding $R_i$ 472 and $R_f$ 474 of L amplifier 404 and R amplifier 424, the choice the Ri and Rf is constrained to a higher limit for noise reasons. As shown in FIG. 4, CM amplifier 414 is configured as a voltage divider. CM amplifier 414 includes an operational amplifier, with one of the input being a reference voltage, REF 492. The other input terminal is coupled to a voltage divider including p·$R_i$ 482 and p·$R_f$ 484. One terminal of p·$R_i$ 482 is coupled to a ground voltage, GND 460, and the other terminal of p·$R_i$ 482 is coupled to the input terminal of CM amplifier 414 that is coupled to the voltage divider. Also, p·$R_f$ 484 constitutes the feedback path of CM amplifier 414. As shown in FIG. 4, $R_f$ 474 and, consequently, p·$R_f$ 484 are varied to equally tune the gain amplitudes associated with the respective amplifiers.

In an embodiment, a same reference voltage, REFINT 494, is generated for each of L amplifier 404 and R amplifier 424 from the virtual ground of the output of CM amplifier 414, HSOCM 416. Thus, REFINT (internal reference voltage of left and right amplifiers) 494 is derived from the terminal of p·$R_i$ 482 coupled to CM amplifier 414. Ignoring factors other than G, the noise voltage associated with REFINT 494 and the noise voltage associated with HSOCM 416 is mathematically related, as expressed in example Equation (3) as:

$$REFINT_n = \frac{HSOCM_n}{(1+G)} \quad (3)$$

In Equation (3) and subsequent equations, the subscript n refers to noise. Thus, in Equation (3), $REFINT_n$ refers to the noise voltage associated with REFINT 494 and $HSOCM_n$ refers to the noise voltage associated with HSOCM 416. L amplifier 404 and R amplifier 424 are configured to amplify $REFINT_n$, as REFINT 494 is input to each of L amplifier 404 and R amplifier 424. ignoring the noise of L amplifier 404, R amplifier 424, the noise due to $R_f$ 474 and factors other than G, the noise output voltage of L amplifier 404 and R amplifier 424, viz. $HSOL_n$ and $HSOR_n$ respectively, are related to $REFINT_n$ input in example Equation (4) as:

$$HSO(L,R)_n = REFINT_n \cdot (1+G) \quad (4)$$

Therefore, $HSOCM_n$ is equal to $HSOL_n$ and $HSOR_n$, as seen from Equations (3) and (4). Thus, the noise at COM 418 and at the noise at L 408/R 428 is canceled when differentially measured across $R_L$ 410 and $R_R$ 430.

Taking the noise of L amplifier 404, R amplifier 424, $R_f$ 474, and p·$R_f$ 484 into account, the output noise power at COM 418 is expressed in example Equation (5) as:

$$HSOCM_n{}^2 = REF_n{}^2 \cdot G^2 + CM_{AMP_n}{}^2 \cdot (1+G)^2 + 4kT \cdot p \cdot R_f (1+G) \quad (5)$$

where $HSOCM_n{}^2$ is the noise power at COM 418, $REF_n{}^2$ is the reference noise power, $CM_{AMP_n}{}^2$ is the noise power due to CM amplifier 414, k is the Boltzmann constant, and T is the temperature. The third contributor to the right side of Equation (5) is the noise power due to p·$R_f$ 484.

Output noise power at L 408/R 428 is expressed in example Equation (6) as:

$$HSO(L,R)_n{}^2 = REFINT_n{}^2 \cdot (1+G)^2 + (L,R)_{AMP_n}{}^2 \cdot (1+G)^2 + 4kT \cdot R_f (1+G), \quad (6)$$

where $HSOL_n{}^2$ and $HSOR_n{}^2$ are the noise power at L 408 and the noise power at R 428 respectively, $REFINT_n{}^2$ is the noise power due to REFINT 494, and $L_{AMP_n}^2$ and $R_{AMP_n}^2$ are the noise power due to L amplifier 404 and R amplifier 424 respectively. The third contributor to the right side of Equation (6) is the noise power due to $R_f$ 474.

Now, analogous to Equation (3), noise power due to REFINT 494 and the noise power at COM 418 is related, as expressed in Equation (7) as:

$$REFINT_n^2 = \frac{HSOCM_n^2}{(1+G)^2} \qquad (7)$$

Through the substitution of Equation (7) in Equation (6), Equation (8) is obtained as:

$$HSO(L,R)_n^2 = HSOCM_n^2 + (L,R)_{AMP_n}^2 \cdot (1+G)^2 + 4kT \cdot R_f \cdot (1+G), \qquad (8)$$

Thus, the noise power across each of $R_L$ 410 and $R_R$ 430 is expressed in example Equation (9) as:

$$HSO(L,R)_n^2 - HSOCM_n^2 = (L,R)_{AMP_n}^x \cdot (1+G)^2 + 4kT \cdot R_f \cdot (1+G) \qquad (9)$$

As seen in Equation (9), the noise power across each of $R_L$ 410 and $R_R$ 430 is independent of the noise power/contributions due to CM amplifier 414 (e.g., due to $p \cdot R_f$ 484), and is dependent only on the noise contributions due to L amplifier 404 and R amplifier 424. Even the noise contribution due to REF 492 does not affect the noise power across each of $R_L$ 410 and $R_R$ 430 as the appropriate REFINT 494 is input to each of L amplifier 404 and R amplifier 424. Thus, the noise power due to CM amplifier 414 and any reference voltage/noise (e.g., REF 492, $REF_n$) in the circuit is canceled across each of $R_L$ 410 and $R_R$ 430.

In contrast, in FIG. 1, as the noise power at COM 118 and L 108/R 128 are uncorrelated, the noise contribution due to an extra amplifier (e.g., CM amplifier 114) appears across $R_L$ 110 and $R_R$ 130, in addition to the noise contribution due to L amplifier 104/R amplifier 124. In FIG. 2, each of L amplifier 204 and R amplifier 224 includes a reference voltage input (not shown), in addition to L input 202 and R input 204. The aforementioned reference voltage is generated through another circuit, which contributes to noise power across $R_L$ 210 and $R_R$ 230. Thus, headset driving unit 100 and headset driving unit 200 causes a noise power due to an extra amplifier (and resistors associated therewith) and/or a reference voltage source to be manifested across $R_L$ (110, 210) and $R_R$ (130, 230), in contrast to headset driving unit 400 of FIG. 4.

In an embodiment, headset driving unit 300 includes a reference voltage source. As headset driving unit 300 does not include an extra amplifier, the noise output across $R_L$ 310 and $R_R$ 330 only includes the contributions due to L amplifier 304 and R amplifier 324. However, the generation of a negative supply voltage (e.g., $V_{DD-}$ 360) necessitates the utilization of a process mask to create a deep N-well, which increases chip area/costs associated therewith. Moreover, the current drawn from $V_{DD+}$ 340 is increased, as discussed above. Utilization of headset driving unit 400 avoids at least the aforementioned problems associated with headset driving unit 100, headset driving unit 200, and headset driving unit 300. The driver amplifiers and the CM amplifiers discussed with regard to FIGS. 1-4 are operational amplifiers. Again, as discussed above with reference to FIG. 1, CM amplifier 414 is configured to generate HSOCM 416, which eliminates the DC bias level in HSOL 406 and HSOR 426 across $R_L$ 410 and $R_R$ 430. Headset driving unit 400 also consumes lower power when compared to headset driving unit 100, headset driving unit 200, and headset driving unit 300. Reduced area and reduced power consumption is accomplished through headset driving unit 400 without modifying the interfaces to the speakers associated with a headset. CM amplifier 414 is chosen to be as inexpensive as possible, in addition to the noisiness, as the noise power across $R_L$ 410 and $R_R$ 430 does not include the contributions associated with CM amplifier 414.

In an embodiment, $R_i$ 472 and $R_f$ 474 is not increased by much due to the prospective increase in the noise contribution, but $p \cdot R_i$ 482 and $p \cdot R_f$ 484 are made as high as possible. The design focus is shifted solely to CM amplifier 414. While headset driving unit 400 includes class AB amplifiers, the technique described herein applies to class G and class H amplifiers too, where the supply voltages are switched to a lower voltage level to save power. Further, HSOCM 416 (i.e., the CM voltage) is reduced through reducing the gain (G). When HSOCM 416 is reduced close to GND 460, a class G/class H operation is performed seamlessly with headset driving unit 400. Thus, the supply voltage (e.g., through Switched-Mode Power Supply (SMPS)) is reduced, leading to less power consumption from the power source. Also, as a user of an audio system including headset driving unit 400 may prefer to listen to audio with a reduced volume, the ability to freely move the CM voltage aids the utilization of a low supply voltage.

A high noise scenario involves small L amplifier 404 and R amplifier 424 and a small reference voltage (REF 492). The operation at low current discussed above allows for utilization of small capacitors for CM amplifier compensation. Therefore, the area savings (e.g., silicon area savings) associated with headset driving unit 400 is further increased. Headset driving unit 400 does not have a filtering requirement associated with REF 492. Therefore, headset driving unit 400 leads to component savings.

Figure 5:
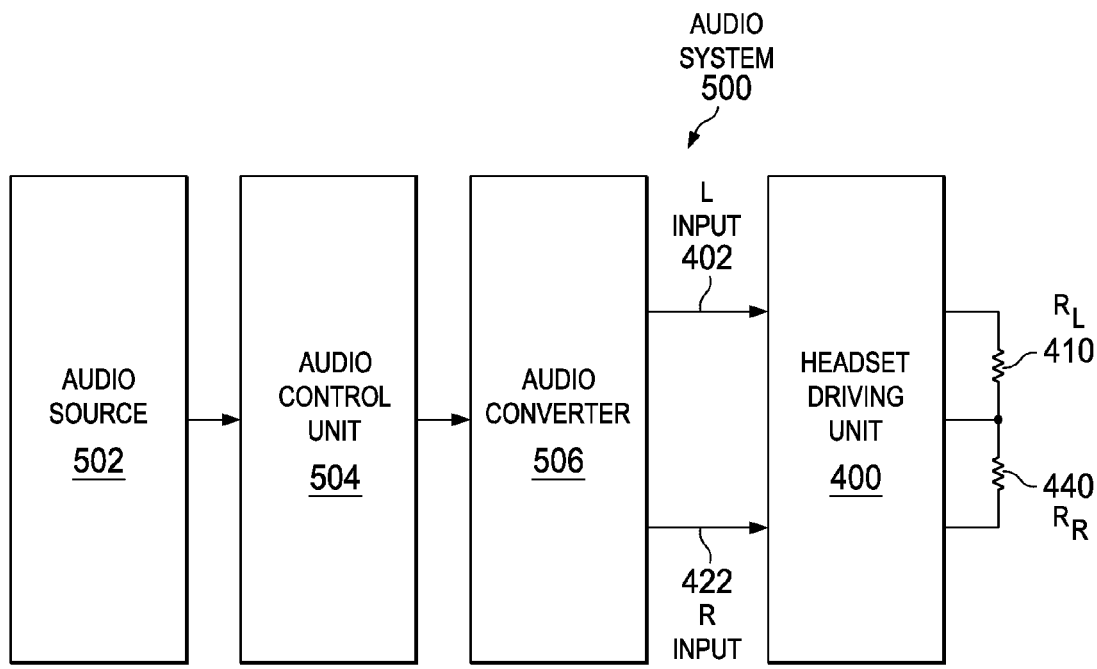
FIG. 5 is a schematic view of an audio system including the headset driving unit of FIG. 4, with speakers.

FIG. 5 illustrates an audio system 500 including headset driving unit 400 with speakers coupled (shown as $R_L$ 410 and $R_R$ 430), according to one or more embodiments. Audio system 500 includes an audio source 502 coupled to an audio control unit 504. For example, audio source 502 is a digital audio file stored in a memory of a data processing unit (e.g., a computing system, a mobile phone, an Apple® iPod™) or voice data associated with the data processing unit (e.g., an IP phone, a mobile phone). Audio source 502 is configured to output signals associated with both the L channel and the R channel. Audio control unit 504 may be configured to adjust parameters (e.g., volume adjustment) associated with the output of audio source 502, and to transmit the adjusted output to an audio converter 506. Audio converter 506 is a Digital-to-Analog Converter (DAC) configured to convert a digital signal to an analog format compatible with headset driving unit 400. The L channel and R channel outputs associated with audio converter 506 are L input 402 and R input 422 respectively. Headset driving unit 400 has interfaces (e.g., ports) associated with L 408, R 428, and COM 418. Loudspeakers/headphones/earphones/headsets are coupled to headset driving unit 400 by way of the aforementioned terminals. $R_L$ 410 and $R_R$ 430 are the resistances associated with the loudspeakers/headphones/earphones/headsets.

In an embodiment, a chip including headset driving unit 400 is provided in a mobile phone. The mobile phone includes appropriate circuitry (e.g., DAC) that is configured to detect the presence of headphones/headset/earphones. When the headphones/headsets/earphones are inserted, the circuitry detects the presence through an impedance measurement. Also, the chip associated with headset driving unit 400 can be in a sleep-mode which is activated following the detection of the presence of the headphones/headsets/earphones.

It is to be noted that the concepts discussed herein also applies to scenarios where outputs from a current DAC (IDAC) serves as L input 402 and R input 422. In the aforementioned scenarios, resistors such as $R_i$ 472 and $p \cdot R_i$ 482 are not required. Further, the gain (G) associated with CM amplifier 414, L amplifier 404, and R amplifier 424 is not a factor in the noise at the outputs. Therefore, the noise associated with REF 492 is low. It is noted that the headset driving unit 400 is called so for the sake of convenience. Examples of alternatives to headset driving unit 400 include headphone driving unit 400, speaker driving unit 400 and earphone driving unit 400. The concepts discussed herein are valid for all scenarios requiring audio output. The aforementioned scenarios utilize any form of electro-acoustic transducers (e.g., headsets, headphones, loudspeakers, earphones).

Figure 6:
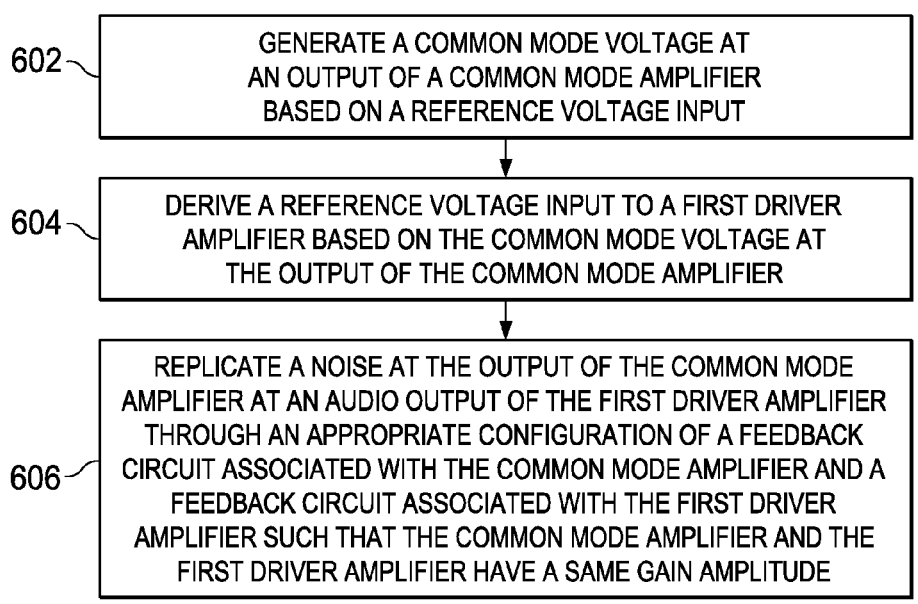
FIG. 6 is a process flow diagram detailing the operations involved in a method of realizing the headset driving unit of FIG. 4.

FIG. 6 illustrates a process flow diagram detailing the operations involved in a method of realizing headset driving unit 400, according to an embodiment. Operation 602 generates a CM voltage (e.g., HSOCM 416) at an output of a CM amplifier (e.g., CM amplifier 414) based on a reference voltage input (e.g., REF 492). Operation 604 derives a reference voltage (e.g., REFINT 494) to a first driver amplifier (e.g., L amplifier 404, R amplifier 424) based on the CM voltage (e.g., HSOCM 416) at the output of the CM amplifier (e.g., CM amplifier 414). An audio input is provided to the first driver amplifier (e.g., L input 402, R input 422). Operation 606 replicates a noise at the output of the CM amplifier at an audio output (e.g., HSOL 406/HSOR 426) of the first driver amplifier (e.g., L amplifier 404, R amplifier 424) through an appropriate configuration of a feedback circuit associated with the CM amplifier and a feedback circuit associated with the first driver amplifier such that the CM amplifier and the first driver amplifier have a same gain amplitude associated therewith. It is noted that steps 602-606 is applicable in case of a second driver amplifier (having an audio input) associated with a second speaker in an audio system.

In addition, it will be appreciated that the various operations, processes, and methods disclosed herein may be embodied in a machine-readable medium or a machine accessible medium compatible with a data processing system, and may be performed in any order. Accordingly, the specification and drawings are to be regarded in an illustrative rather than a restrictive sense.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A driver circuit comprising:
a first driver amplifier that is configured to generate a first output in response to an input connected to a first reference voltage and a first audio input;
a second driver amplifier that is configured to generate a second output in response to an input connected to the first reference voltage and a second audio input; and
a common mode (CM) amplifier, coupled to the first driver amplifier and the second driver amplifier, the CM amplifier being configured to generate an output of the CM amplifier in response to an input connected to a second reference voltage and an input connected to the first reference voltage, the first reference voltage being a divided version of the output of the common mode (CM) amplifier,
wherein gains of the first driver amplifier, second driver amplifier and the CM amplifier are equal and wherein noise at the output appears across a plurality of resistors coupled at the outputs of the first driver amplifier, second driver amplifier and the CM amplifier and cancels with respect to the output of the CM amplifier.

2. The driver circuit of claim 1 and further comprising a plurality of feedback circuits coupled to each of the first driver amplifier, the second driver amplifier and the CM amplifier.

3. The driver circuit of claim 1, wherein the noise at the output of the CM amplifier is associated with at least one of the CM amplifier, the second reference voltage input and a circuit element associated with the CM amplifier.

4. The driver circuit of claim 1, further comprising:
a first interface coupled between the first output of the first driver amplifier and the output of the CM amplifier, the first interface that enables coupling of a first speaker; and
a second interface coupled between the output of the CM amplifier and the second output of the second driver amplifier, the second interface that enables coupling of a second speaker;
wherein the noise at the output of the CM amplifier is differentially canceled across the first speaker and the second speaker.

5. The driver circuit of claim 1, wherein the first driver amplifier, second driver amplifier and the CM amplifier are operational amplifiers.

6. The driver circuit of claim 1, wherein a CM voltage is reduced through reducing the gain amplitude associated with the CM amplifier and the first driver amplifier, and wherein each of the first driver amplifier and the CM amplifier is operated at a lower supply voltage based on the reduction of the CM voltage.

7. The circuit of claim 1, wherein the CM amplifier comprises an input resistor coupled to the input terminal and the feedback circuit comprises a feedback resistor, wherein the first driver amplifier comprises an input resistor coupled to the audio, and wherein each of the CM amplifier and the first driver amplifier is configured to have a same ratio of the input resistor to the feedback resistor in the feedback circuit.

8. The circuit of claim 7, wherein each of the input resistor and the feedback resistor in the feedback circuit of the CM amplifier has a higher resistance than the corresponding each of the input resistor and the feedback resistor in the feedback circuit of the first driver amplifier.

9. An audio system comprising:
an audio source configured to generate an audio signal;
a set of driver circuits including a first driver amplifier and a second driver amplifier, each of the first driver amplifier and the second driver amplifier being configured to generate an audio output based on an audio input and having a feedback circuit coupled between a terminal associated with the audio output and a terminal configured to receive the audio input; a common mode (CM) amplifier, coupled to the first driver amplifier and the second driver amplifier and configured to generate a CM voltage at an output based on a reference voltage input, the CM amplifier having a feedback circuit coupled between the output and an input terminal, a reference voltage input to the first driver amplifier and the second driver amplifier being derived based on the CM voltage through the input terminal of the CM amplifier, and the feedback circuit of the CM amplifier, the feedback circuit of the first driver amplifier and the feedback circuit of the second driver amplifier being configured to enable the CM amplifier, the first driver amplifier and the second driver amplifier to have a same gain amplitude such that a noise at the output of the CM amplifier is replicated at each of the terminal of the first driver amplifier and the second driver amplifier associated with the audio output to render a differential noise across the terminal of the each of the first driver amplifier and the second driver amplifier associated with the audio output independent of the noise at the output of the CM amplifier;

a first interface associated with the audio output of the first driver amplifier;

a second interface associated with the output of the CM amplifier;

a third interface associated with the audio output of the second driver amplifier;

a first speaker; and a second speaker, wherein the noise at the output of the CM amplifier is differentially canceled across each of the first speaker and the second speaker when the first speaker and the second speaker are coupled between the first interface and the second interface and the third interface and the second interface respectively.

10. The audio system of claim 9, wherein the noise at the output of the CM amplifier is associated with at least one of the CM amplifier, the reference voltage input and a circuit element associated with the CM amplifier.

11. The audio system of claim 9, wherein the each of the first speaker and the second speaker is one of a headphone speaker, an earphone speaker, a headset speaker and a loudspeaker.

12. The audio system of claim 9, wherein the CM amplifier, the first driver amplifier and the second driver amplifier are operational amplifiers.

13. The audio system of claim 9, wherein the CM amplifier includes an input resistor coupled to the input terminal and the feedback circuit includes a feedback resistor, wherein the each of the first driver amplifier and the second driver amplifier includes an input resistor coupled to the audio input and the feedback circuit also includes a feedback resistor, and wherein each of the CM amplifier, the first driver amplifier and the second driver amplifier is configured to have a same ratio of the input resistor to the feedback resistor in the feedback circuit.

* * * * *